US007825564B2

(12) United States Patent
Croft et al.

(10) Patent No.: US 7,825,564 B2
(45) Date of Patent: Nov. 2, 2010

(54) CONTROLLER FOR A HIGH FREQUENCY AGITATION SOURCE

(75) Inventors: Nathan James Croft, Wiltshire (GB); Paul Graham Douglas, Wiltshire (GB)

(73) Assignee: Dyson Technology Limited, Malmesbury, Wiltshire (GB)

( * ) Notice: Subject to any disclaimer, the term of this patent is extended or adjusted under 35 U.S.C. 154(b) by 145 days.

(21) Appl. No.: 12/162,300

(22) PCT Filed: Feb. 7, 2007

(86) PCT No.: PCT/GB2007/000426

§ 371 (c)(1), (2), (4) Date: Aug. 21, 2008

(87) PCT Pub. No.: WO2007/091063

PCT Pub. Date: Aug. 16, 2007

(65) Prior Publication Data

US 2009/0026883 A1 Jan. 29, 2009

(30) Foreign Application Priority Data

Feb. 8, 2006 (GB) ................................ 0602465.7
Sep. 20, 2006 (GB) ................................ 0618483.2

(51) Int. Cl.
*H01L 41/08* (2006.01)

(52) U.S. Cl. .................. 310/317; 310/316.01; 310/324; 310/323.01

(58) Field of Classification Search ............ 310/316.01, 310/316.02, 316.03, 317, 319, 3
See application file for complete search history.

(56) References Cited

U.S. PATENT DOCUMENTS 4,001,650 A 1/1977 Romain
4,602,642 A * 7/1986 O'Hara et al. .............. 600/474
5,150,334 A 9/1992 Crosby
5,803,362 A 9/1998 Fraccaroli
5,971,980 A 10/1999 Sherman (Continued)

FOREIGN PATENT DOCUMENTS

GB 2 265 845 10/1993
JP 2003-117282 4/2003

OTHER PUBLICATIONS

GB search report directed to counterpart application GB0618483.2 mailed on Oct. 26, 2006; 1 page.

(Continued)

*Primary Examiner*—Mark Budd
(74) *Attorney, Agent, or Firm*—Morrison & Foerster LLP

(57) ABSTRACT

A controller for a high-frequency agitation source includes a signal generator to generate a drive signal having a variable duty cycle. The drive signal is used to drive the high-frequency agitation source. The controller also includes a temperature detector to detect the temperature of the high-frequency agitation source. The controller is configured to vary the duty cycle of the drive signal in response to the temperature of the high-frequency agitation source. By varying the duty cycle of the drive signal, the average power supplied to the piezoelectric crystal can be varied while still maintaining a fixed amplitude of oscillation. This allows the temperature of a high-frequency agitator, for example, a piezoelectric crystal, to be controlled.

13 Claims, 7 Drawing Sheets

U.S. PATENT DOCUMENTS

| | | | | |
|---|---|---|---|---|
| 6,402,046 | B1 | 6/2002 | Loser | |
| 6,491,840 | B1 * | 12/2002 | Frankenbach et al. | 252/8.91 |
| 6,589,229 | B1 * | 7/2003 | Connelly et al. | 604/890.1 |
| 6,652,766 | B1 * | 11/2003 | Frankenbach et al. | 252/8.91 |
| 6,908,962 | B1 * | 6/2005 | Frankenbach et al. | 524/588 |
| 6,946,623 | B2 * | 9/2005 | Evanyk | 219/240 |
| 2005/0228282 | A1 | 10/2005 | Wang et al. | |

OTHER PUBLICATIONS

GB Search Report directed to counterpart application GB0602465.7 mailed on May 23, 2006; 1 page.

International Search Report directed to counterpart international application PCT/GB2007/000426 mailed on May 16, 2007; 5 pages.

Written Opinion directed to counterpart international application PCT/GB2007/000426; 6 pages.

* cited by examiner

CONTROLLER FOR A HIGH FREQUENCY AGITATION SOURCE

REFERENCE TO RELATED APPLICATIONS

This application is a national stage application under 35 USC 371 of International Application No. PCT/GB2007/000426, filed Feb. 7, 2007, which claims the priority of United Kingdom Application Nos. 0602465.7, filed Feb. 8, 2006, and 0618483.2, filed Sep. 20, 2006, the contents of all of which prior applications are incorporated herein by reference.

FIELD OF THE INVENTION

The invention relates to a controller for a high-frequency agitation source. Particularly, the invention relates to controller for a piezoelectric crystal.

BACKGROUND OF THE INVENTION

High-frequency agitation sources, such as piezoelectric crystals, are well known in the art and are used for a number of purposes. Piezoelectric motors, transformers and linear drives are common. An important use for a piezoelectric crystal is in nebulisation. There are many cases where a fine mist of a substance is required without the application of heat. One example of this is a medical nebuliser, wherein a pharmaceutical compound is nebulised by a piezoelectric crystal in order to be inhaled by a patient. Another use for nebulisers is in the field of water dispersal such as garden water features.

A problem with piezoelectric crystals is that, in operation, they can generate a large amount of thermal energy. A piezoelectric crystal under constant operation may get very hot if appropriate measures to sink the thermal energy (such as heat sinks) are not provided. Piezoelectric crystals are prone to damage at high temperatures so it is desirable that the temperature of the piezoelectric crystal does not become excessive.

When forming part of a nebuliser, a piezoelectric crystal acts on a head of liquid in order to disperse the liquid into a fine mist. During operation of the piezoelectric crystal, the head of liquid absorbs the vibrational energy and sinks some of the thermal energy of the piezoelectric crystal. This has the effect of cooling the piezoelectric crystal. However, if the piezoelectric crystal continues to operate when all of the liquid has been nebulised, the temperature of the crystal will rapidly increase. This may lead to thermal damage. Further, it is desirable that unnecessary use of the piezoelectric crystal (which can be wasteful of energy) is avoided.

Prior art methods to deal with this problem are illustrated in U.S. Pat. No. 4,001,650 and U.S. Pat. No. 5,803,362. U.S. Pat. No. 4,001,650 discloses the use of a detector to detect surface motion of liquid in the nebuliser. When no surface motion is detected, the liquid is deemed to have been completely evaporated and the nebulisation process is stopped. However, the arrangement of U.S. Pat. No. 4,001,650 requires complicated detectors.

U.S. Pat. No. 5,803,362 discloses a temperature control device which is capable of varying the power fed to an oscillator circuit depending upon the temperature of a piezoelectric crystal. This process can prevent the temperature of a piezoelectric crystal from exceeding a maximum temperature. However, varying the power supplied to (and thus the amplitude of oscillation of) a piezoelectric crystal can be an inefficient method of controlling a piezoelectric crystal.

SUMMARY OF THE INVENTION

It is an object of the present invention to provide a controller for a high-frequency agitation source (such as a piezoelectric crystal) which is able to detect the status of a piezoelectric crystal and control the piezoelectric crystal accordingly. It is a further object of the present invention to prevent the piezoelectric crystal from reaching high temperatures by examining changes in the temperature and the power requirements of the piezoelectric crystal, deducing the status of the piezoelectric crystal from this information and taking action accordingly.

The invention provides a controller for a high-frequency agitation source, the controller comprising signal generation means for generating a drive signal having a variable duty cycle, the drive signal being used to drive the high-frequency agitation source, the controller further comprising temperature detecting means for detecting a temperature of the high-frequency agitation source, wherein the controller is adapted and arranged to vary the duty cycle of the drive signal in response to the temperature of the high-frequency agitation source. By varying the duty cycle of the drive signal, the average power supplied to the piezoelectric crystal can be varied. However, unlike a conventional arrangement where the average power is varied by changing the amplitude of oscillation, by varying the duty cycle the amplitude of oscillation can be kept relatively constant. This allows the piezoelectric crystal to be driven at the most efficient point for nebulisation and to be switched off when not required or when the temperature of the piezoelectric crystal is too high. In contrast, reducing the amplitude in order to reduce the temperature results in the piezoelectric crystal operating inefficiently because it may be drawing power without producing any nebulisation. This is because at low amplitudes of oscillation, the oscillation of the piezoelectric crystal may be insufficient to cause nebulisation but will still require power in order to operate.

Preferably, the controller is further arranged to control the drive signal in response to a first pre-determined requirement and to determine when the first pre-determined requirement has been satisfied. The operation of the piezoelectric crystal can be dependent upon additional criteria, such as the duty cycle, the temperature or a time, in order to provide fail-safe measures to prevent damage.

Preferably, the first pre-determined requirement is that the duty cycle is reduced below a pre-determined value. It has been shown by experimental analysis that, during a nebulisation process, the temperature of a piezoelectric crystal follows a characteristic profile. Initially, in a system including a nebulisation process, the temperature is seen to increase as energy is imparted to agitate the piezoelectric crystal. Once the system reaches thermal equilibrium, the majority of the energy imparted by the piezoelectric crystal is used to nebulise the liquid. Therefore, there will be a small or negligible change in temperature at this point. Finally, when the liquid has been completely nebulised, the temperature of the piezoelectric crystal is again seen to increase. If this behaviour is observed, then the controller will reduce the duty cycle of the drive signal in order to prevent the temperature from exceeding the pre-determined temperature. Therefore, it can be inferred from the value of the duty cycle during nebulisation that the end of the nebulisation process has occurred without directly measuring the amount of liquid within the nebuliser. This technique is particularly useful to prevent excessive heating and use of a piezoelectric crystal in an automatic system without user control. Such a system may be required to operate for days, months or even years without user intervention.

If the piezoelectric crystal is operating correctly and predictably, the controller can infer whether or not liquid is present. The controller can determine when the nebulisation process is complete by monitoring the temperature and the drive signal. Therefore, the piezoelectric crystal can be switched off when the nebulisation is complete and the piezoelectric crystal is still at a relatively low temperature. The above arrangement can prevent unnecessary thermal damage and wear through use.

The invention provides a self-contained control system which is able to complete a nebulisation process quickly and efficiently. The control system can also minimise unnecessary use of, and thermal wear on, the piezoelectric crystal. The invention is particularly suitable to drive a nebuliser for use in a hand dryer.

BRIEF DESCRIPTION OF THE DRAWINGS

An embodiment of the invention will now be described with reference to the accompanying drawings, in which.

DETAILED DESCRIPTION OF THE INVENTION

Figure 1:
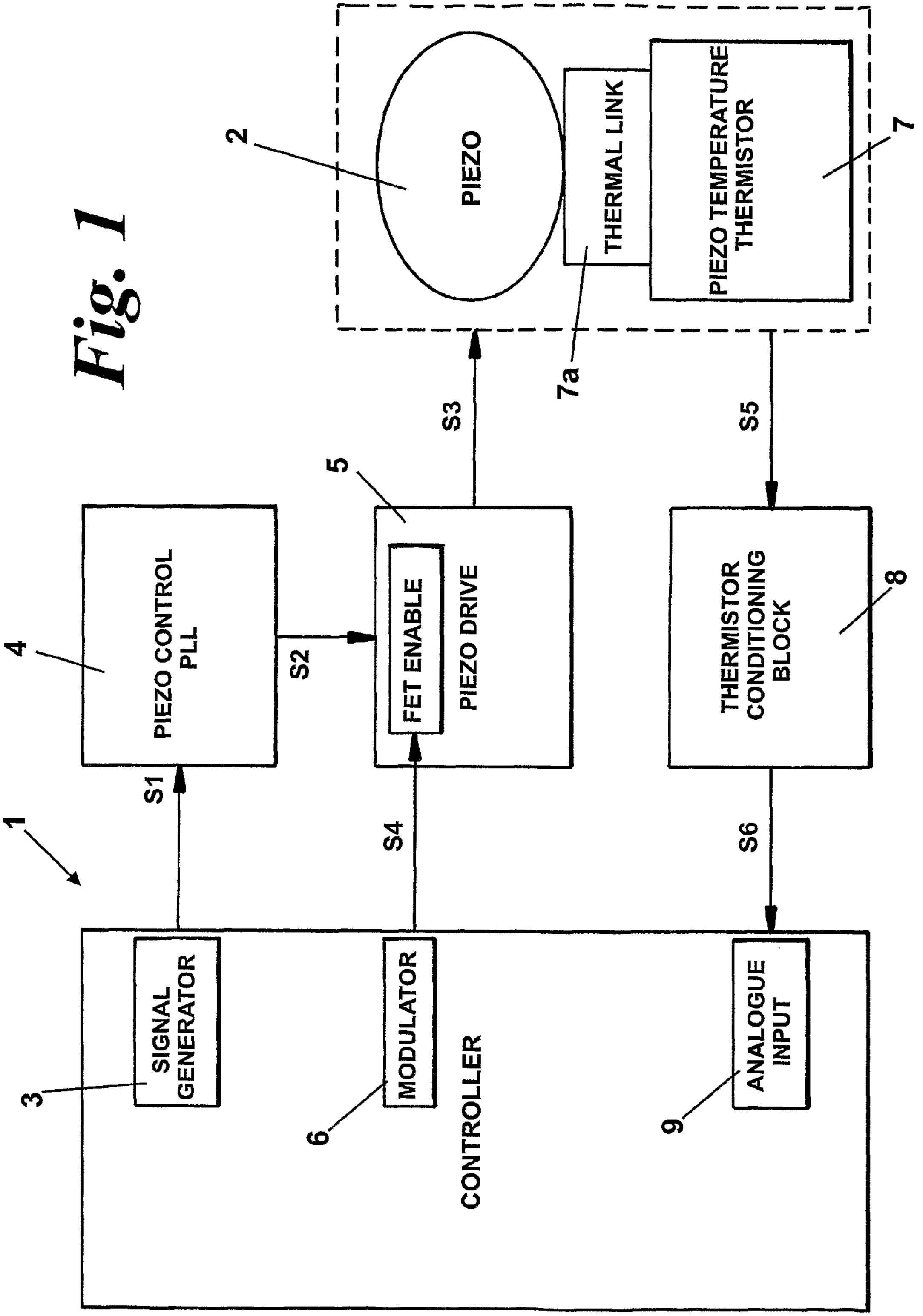
FIG. 1 shows a block diagram of the components and operation scheme of a controller according to the invention.

FIG. 1 shows the controller 1 and piezoelectric crystal 2 according to the invention. The controller 1 includes a signal generator 3. The signal generator 3 generates a synchronisation signal S1 at a specified frequency, for example 1.66 kHz. This frequency may be variable in order to drive the piezoelectric crystal 2 at an optimum frequency. The optimum frequency can be determined by measurement of the operational characteristics of the piezoelectric crystal 2 and by transmission of this information to the controller 1. The technique of frequency selection is not material to the present invention and will not be discussed further.

A phase locked loop (PLL) 4 is connected to the signal generator 3. The PLL multiplies the synchronisation signal S1 by a specified amount to give a signal S2 at a higher frequency, for example 1.699 MHz. The output S2 from the PLL 4 is connected to the piezo drive 5. The piezo drive 5 comprises switching means such as a Power Metal Oxide Field Effect Transistor (Power MOSFET). The piezo drive 5 converts the signal S2 to a drive signal S3. The drive signal S3 is a sinusoidal waveform of an appropriate voltage to drive the piezoelectric crystal 2. The components and functioning of the piezo drive 5 are not material to the present invention and will not be discussed further. A modulator 6 is connected to the piezo drive 5 and provides a modulation signal S4 to control the piezo drive 5 as required. The modulator 6 can be used to provide a pulse train with a variable duty cycle.

The piezoelectric crystal 2 comprises a ceramic material (which is responsive to an electric field) and electrical contacts. Piezoelectric crystals are well known in the art and any suitable piezoelectric crystal can be used. A negative temperature coefficient (NTC) thermistor 7 is connected to the piezoelectric crystal 2 by a thermal link 7*a*. The thermal link 7*a* is a thermally conductive and malleable material which is in conformal contact with both the NTC thermistor 7 and the piezoelectric crystal 2. The NTC thermistor has a resistance that is dependent upon temperature. A thermistor conditioning block 8 converts a signal S5 from the NTC thermistor 7 into a temperature signal S6 which is suitable for the controller 1. An analogue input 9 forming part of the controller 1 receives the temperature signal S6 from the thermistor conditioning block 8. The controller 1 uses the temperature signal S6 to determine the status of the piezoelectric crystal 2 and to control the drive signal S3.

In operation, the signal generator 3 generates a synchronisation signal S1 of a particular frequency. The synchronisation signal S1 is then supplied to the PLL 4. The PLL 4 multiplies the synchronisation signal by 1024 to generate a signal S2. The piezo drive 5 converts the signal S2 into a drive signal S3. The drive signal S3 has a sinusoidal waveform with a frequency equal to the signal S2. The drive signal S3 also has a peak to peak voltage in the region of 100-140 V. The drive signal S3 is supplied to the piezoelectric crystal 2 in order to drive the piezoelectric crystal 2 in the required manner.

The operation of the piezo drive 5 is controlled by the modulator 6. The modulator 6 controls the piezo drive 5 with a modulation signal S4. The modulation signal S4 can take the form of a pulse train having a duty cycle. The duty cycle of the modulation signal S4 is determined by the controller 1 on the basis of the temperature signal S6. The modulation signal S4 is supplied to the piezo drive 5 and modulates the drive signal S3. Therefore, the modulator 6 is able to control the drive signal S3 by switching it on or off. Under the action of the modulator 6, the drive signal S3 takes the form of a series of wave "packets" or pulses (on state), with a "dead time" (off state) in between. The dead time is determined by the duty cycle which is the ratio of the pulse width to the period.

When the piezoelectric crystal 2 is operating, thermal energy will be generated. This thermal energy will change the resistance of the NTC thermistor 7. This is because the NTC thermistor 7 is in thermal contact with the piezoelectric crystal 2 by means of the thermal link 7*a*. The change in resistance of the NTC thermistor 7 causes a change in the signal S5. The signal S5 is converted by the thermistor conditioning block 8 into a temperature signal S6 suitable for the analogue input 9 of the controller 1. The temperature signal S6 contains the same information as the signal S5.

Figure 2:
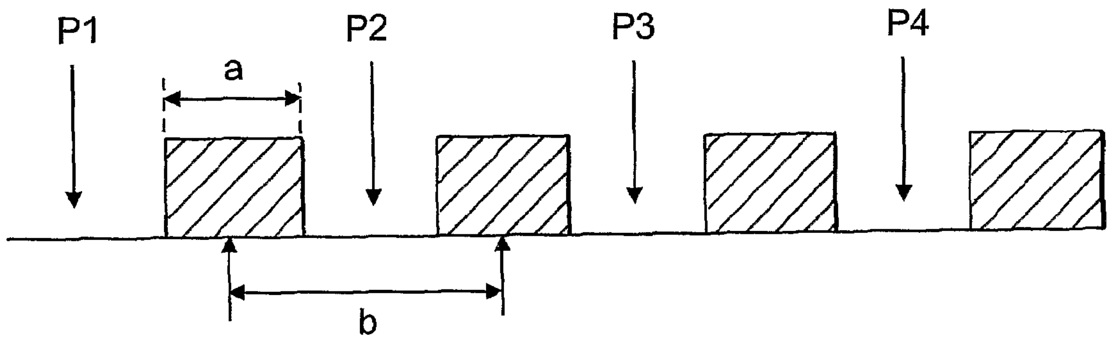
FIG. 2 shows the measurement periods and the occurrences of the temperature measurements made by the controller.

When the analogue input 9 receives the signal S6, the controller 1 evaluates the temperature signal S6. In this embodiment, the temperature signal S6 is sampled at regular intervals. It is advantageous that the temperature signal S6 is sampled when the piezoelectric crystal 2 is not in operation. This is to reduce the background noise and temperature variations which may be introduced by the operation of the piezoelectric crystal 2. FIG. 2 shows a schematic diagram illustrating the points at which the temperature signal S6 is sampled. The sample points P1, P2, P3, P4 are uniformly spaced and occur in the "dead time" between pulses of the drive signal S3. The pulses of the drive signal S3 have a pulse width a and a period b. Therefore, in this case the duty cycle D is equal to a/b. The "dead time" in between pulses is the optimum time for sampling the temperature signal S6. The value of the temperature signal S6 is related to and representative of the actual temperature so that the controller 1 can determine the actual temperature of the piezoelectric crystal 2.

Figure 3A:
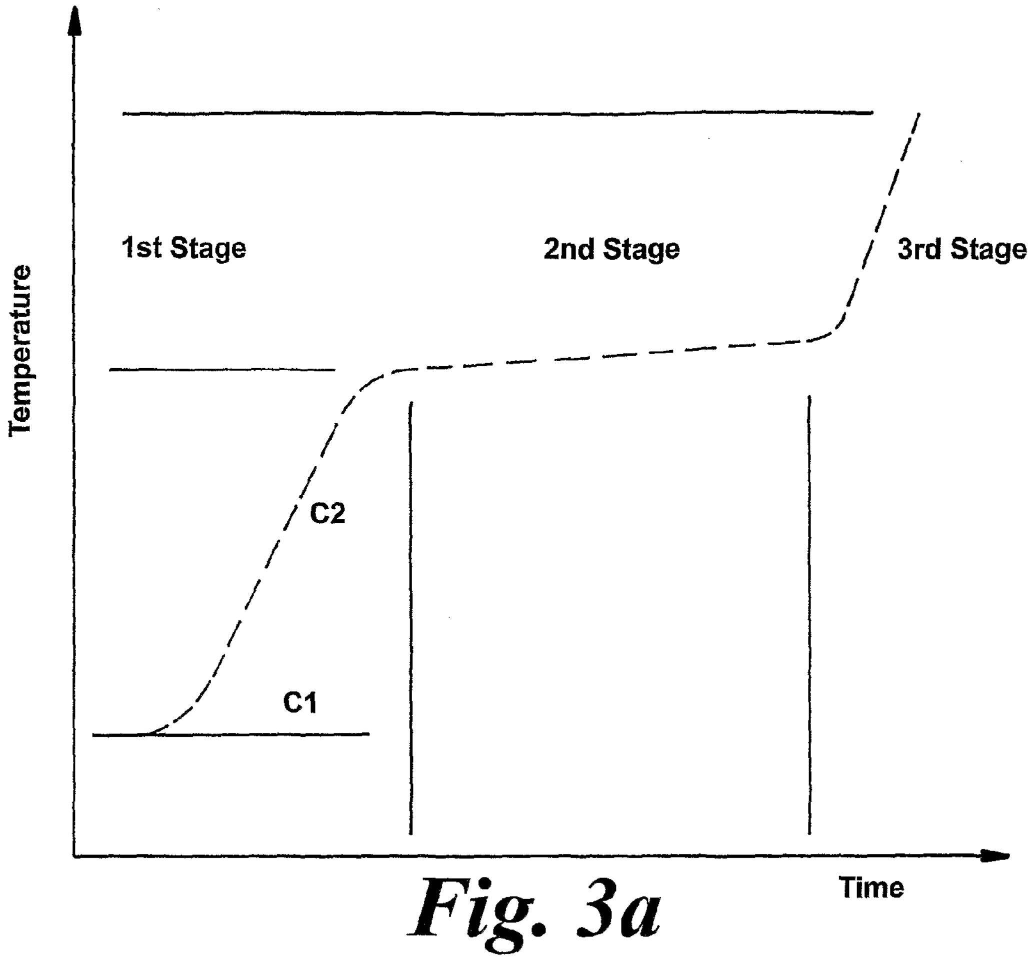
FIG. 3*a* shows a graph of the expected temperature characteristic of a piezoelectric crystal during a typical nebulisation process.
Figure 3B:
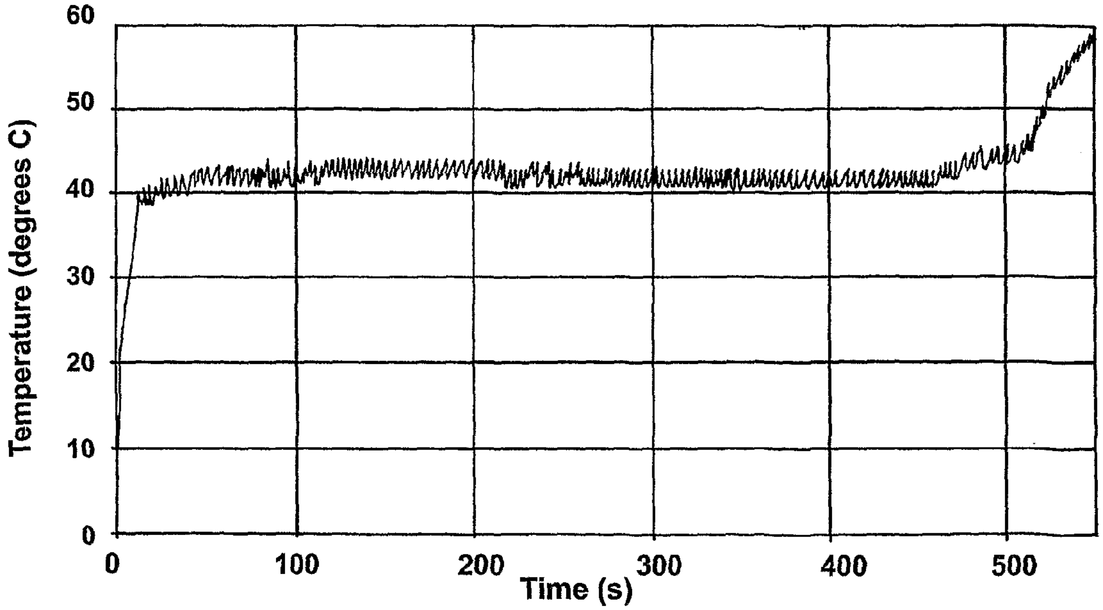
FIG. 3*b* shows a graph of an actual output temperature characteristic of a piezoelectric crystal during a typical nebulisation process.

FIG. 3 shows a graph of a typical nebulisation process without any temperature control. The temperature of the piezoelectric crystal 2 will rise at different rates depending on the state of operation of the piezoelectric crystal 2. If the piezoelectric crystal 2 is broken (line C1), there will not be any significant temperature rise. However, when the piezoelectric crystal 2 is operating correctly, the rate of temperature rise can reveal important information about the environment of the piezoelectric crystal 2. The operation of the piezoelectric crystal 2 through a power cycle will now be described with reference to FIG. 3*a*. Initially, the duty cycle is set to a maximum so that the average power delivered to the piezoelectric crystal 2 is high. Therefore, operation of the piezoelectric crystal 2 will cause the piezoelectric crystal 2 to heat up. It has been shown by experimental analysis that, during a nebulisation process, the temperature of a piezoelectric crystal follows a characteristic profile. Initially, the temperature is seen to increase (first stage). Once the system reaches thermal equilibrium, the energy imparted by the piezoelectric crystal is used to nebulise the liquid. Therefore, the rate of change of temperature with time is seen to decrease (second stage). The value of the temperature may remain constant or even decrease in this stage. Finally, when the liquid has been completely nebulised, the rate of change of temperature with time is again seen to increase (third stage). FIG. 3*b* shows an actual measurement sequence showing the temperature profile described above.

Figure 4A:
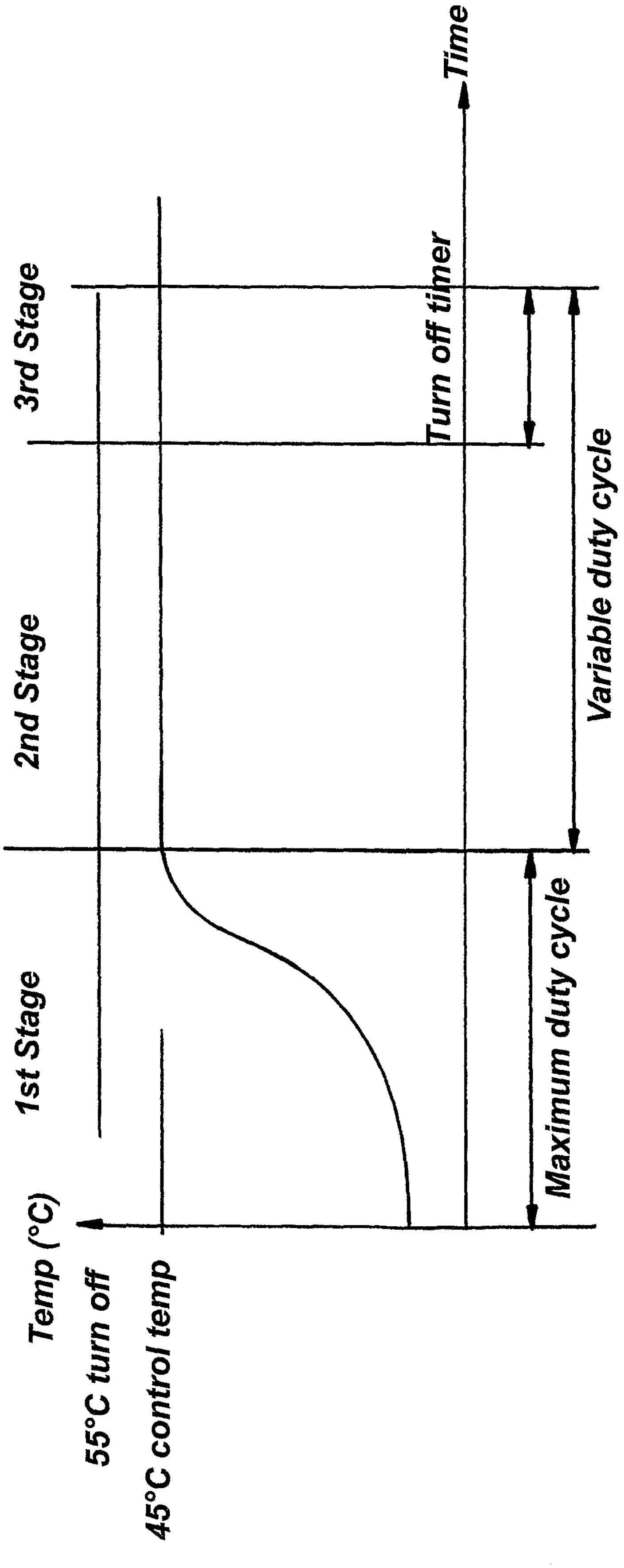
FIG. 4*a* shows a graph of the temperature of the piezoelectric crystal as a function of time during a nebulisation process controlled by the controller of FIG. 1.
Figure 4B:
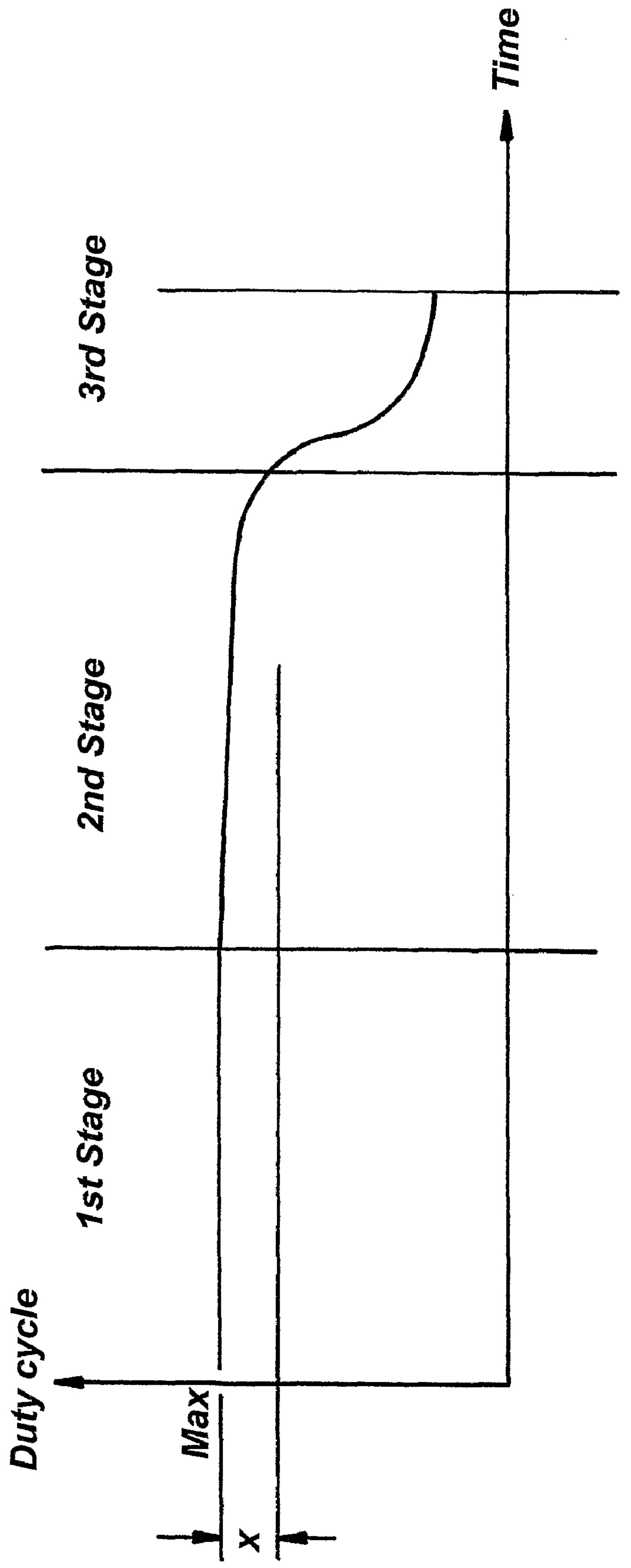
FIG. 4*b* shows a graph of the duty cycle as a function of time during a nebulisation process controlled by the controller of FIG. 1.

The temperature change can be used to detect when the nebulisation process has finished. FIG. 4*a* shows the variation in duty cycle during successive stages of nebulisation and the temperature change of the piezo as a function of time. FIG. 4*b* shows the variation in duty cycle during a nebulisation process under the control of the controller 1. The controller 1 varies the power delivered to a piezoelectric crystal acting on a head of liquid in order to prevent the temperature of the piezoelectric crystal exceeding a pre-determined maximum value. In this embodiment, the pre-determined maximum value is 45° C.

In the first stage of nebulisation with temperature control, the temperature is much lower than both the control temperature of 45° C. (FIG. 4*a*) and the maximum allowable temperature of 55° C. Therefore, the piezoelectric crystal 2 will be driven at the maximum duty cycle available (first stage shown in FIG. 4*b*). When the temperature nears the control temperature of 45° C., the nebulisation enters the second stage. At this point, the controller 1 reduces the duty cycle in order to maintain the temperature of the piezoelectric crystal 2 at 45° C. During the second stage the apparatus will then reach a quasi-thermal equilibrium (temperature curve illustrated in the second stage of FIG. 4*a*) where the energy imparted by the piezoelectric crystal is used to nebulise the liquid.

Finally, in the third stage the liquid will have been completely nebulised and the piezoelectric crystal 2 will heat up more quickly. Therefore, the controller 1 reduces the duty cycle significantly to prevent further temperature rise (third stage shown in FIG. 4*b*). The reduction in duty cycle signifies the end of the nebulisation process. When the duty cycle falls below a level which is a pre-determined amount x below the maximum duty cycle (see FIG. 4*b*), the controller 1 determines that the nebulisation process has finished. The controller 1 can then switch off the piezoelectric crystal 2. The process can then be repeated.

Figure 5:
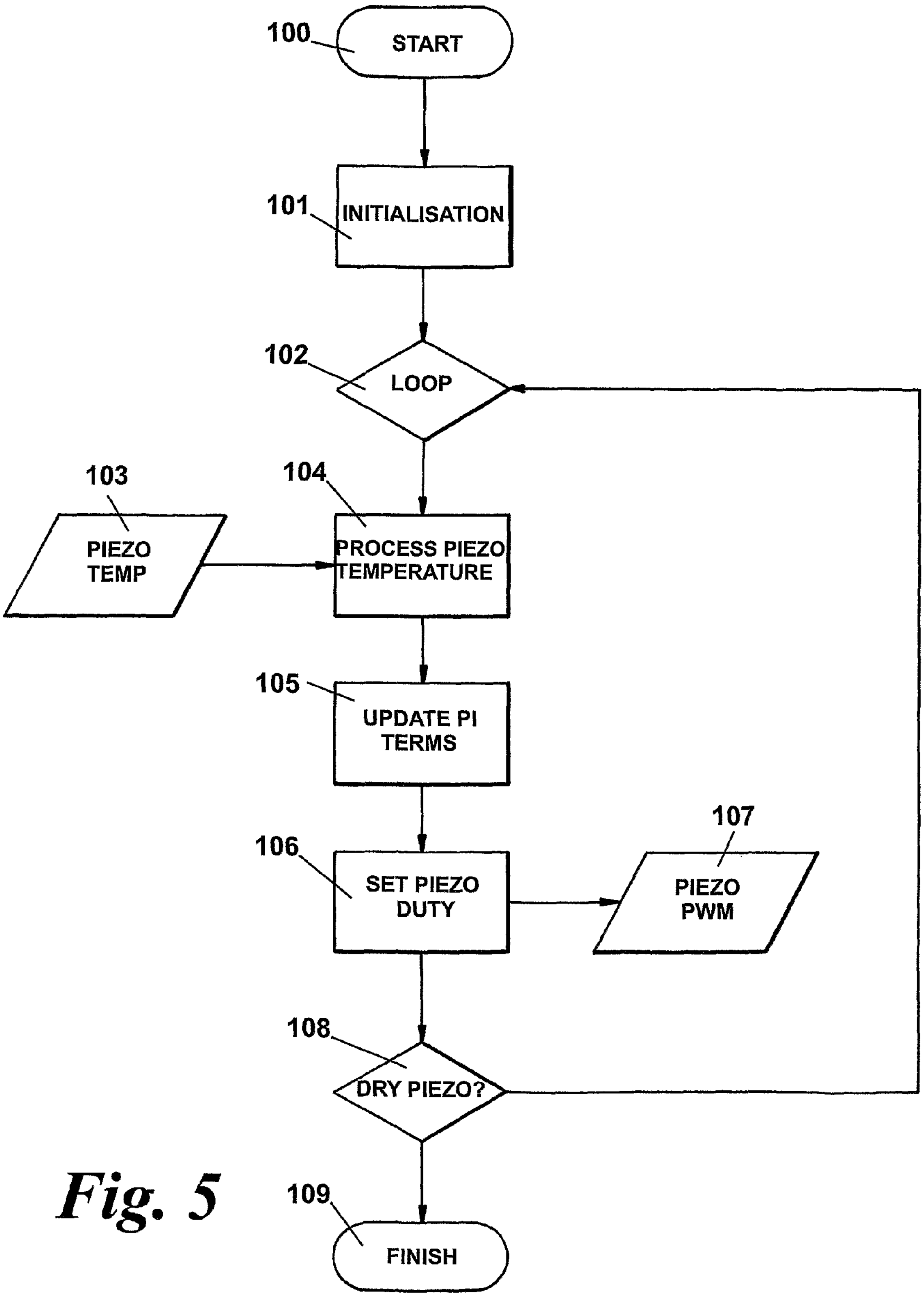
FIG. 5 is a flow chart showing the decisions taken by the controller of FIG. 1 during operation of the piezoelectric crystal.

Referring to FIG. 5, the method of operation of the controller will now be described. At step 100, the controller 1 starts the control operation. The control operation takes the form of a Proportional Integral (PI) loop. At step 101 the controller 1 is initialised. The controller 1 is loaded with a value of the maximum duty cycle. Further, the temperature of the piezoelectric crystal 2 is evaluated. In this step the ambient temperature of the NTC thermistor 7 is measured. The NTC thermistor 7 has a characteristic range of resistances at temperatures between 0° C. and 255° C. This corresponds to a range of characteristic values of the temperature signal S6. Next, at step 102 the controller 1 determines if the temperature reading is valid. The controller 1 achieves this by determining if the temperature signal S6 is within the range of characteristic values.

If the temperature signal S6 is outside the range of characteristic values, or is of a value which is not appropriate to the environment of the piezoelectric crystal 2, the NTC thermistor 7 may be malfunctioning or not be connected properly. If the signal S6 is outside the range of characteristic values, the controller 1 is programmed to terminate the process and switches off the piezo drive 5. An error signal may also be reported.

If the controller 1 determines that the temperature signal S6 is within the expected range of characteristic values, the controller 1 operates the piezo drive 5 (FIG. 1) by supplying a modulated signal S4 (step 105). Initially, the controller 1 generates a modulated signal S4 having the maximum permissible duty cycle. The piezo drive 5 then generates the drive signal S3 which drives the piezoelectric crystal 2. The drive signal S3 also has the maximum permissible duty cycle.

The controller 1 then moves to step 102. At step 102 the controller 1 enters a loop. At step 103 the temperature of the piezoelectric crystal 2 is determined and the result is inputted into a temperature processing step 104. The updated temperature reading is then submitted to the controller 1 to update the PI terms such as the duty cycle. At step 106, the duty cycle of the signal S4 (and therefore the drive signal S3) is set depending upon the temperature measurement. If the temperature is close to, or at, the maximum operating temperature of 45° C., then the duty cycle will be reduced. If the temperature is significantly below 45° C. then the duty cycle will be set at the maximum allowed value. Once the duty cycle of the signal S4 has been set at step 106, the information is transmitted to the piezoelectric crystal 2 at step 107.

At step 108 the magnitude of the duty cycle of the signal S4 is evaluated. If the duty cycle of the signal S4 is below a pre-determined value of the duty cycle then the nebulisation process is deemed to have entered the third stage of the nebulisation, i.e. that the piezoelectric crystal 2 has nebulised all of the head of water and that the piezoelectric crystal 2 is now dry. If the duty cycle of the signal S4 is below the pre-determined value then the controller 1 moves to step 109 and the process is finished.

When the piezo drive 5 is switched off, the piezoelectric crystal 2 is not driven. This avoids unnecessary use of, and thermal damage to, the piezoelectric crystal 2 because the piezoelectric crystal 2 is not driven when there is no head of liquid to nebulise.

In addition to these parameters, whilst operating in each loop stage, the controller 1 has several pre-determined maximum parameters. The controller 1 is programmed also to move to step 109 if a maximum time period has elapsed or a maximum allowable temperature of 55° C. is reached. This maximum allowable temperature is chosen to prevent the build up of limescale. By preventing the build-up of limescale, the life of the piezoelectric crystal 2 can be extended.

The controller 1 according to the invention provides an effective means for controlling a piezoelectric crystal forming part of a nebulisation system. The controller 1 is able to determine if a piezoelectric crystal 2 is functioning correctly, and disable it if it is not. Further, the controller 1 is able to infer when there is no water above the piezoelectric crystal 2 to nebulise and, in that case, can shut down the piezoelectric crystal 2. This prevents wear and thermal damage to the piezoelectric crystal 2. Further, the controller 1 is able to infer when there is no water above the piezoelectric crystal 2 from the thermal behaviour of the piezoelectric crystal 2 and does not require additional detection apparatus such as a water level detector.

The invention may be used in any situation where a high frequency agitation source is required to be driven reliably and effectively, for example in an automatic system without user control or in a nebulisation system without water level monitoring. This is of benefit to applications such as, for example, household appliances or medical devices.

Figure 6:
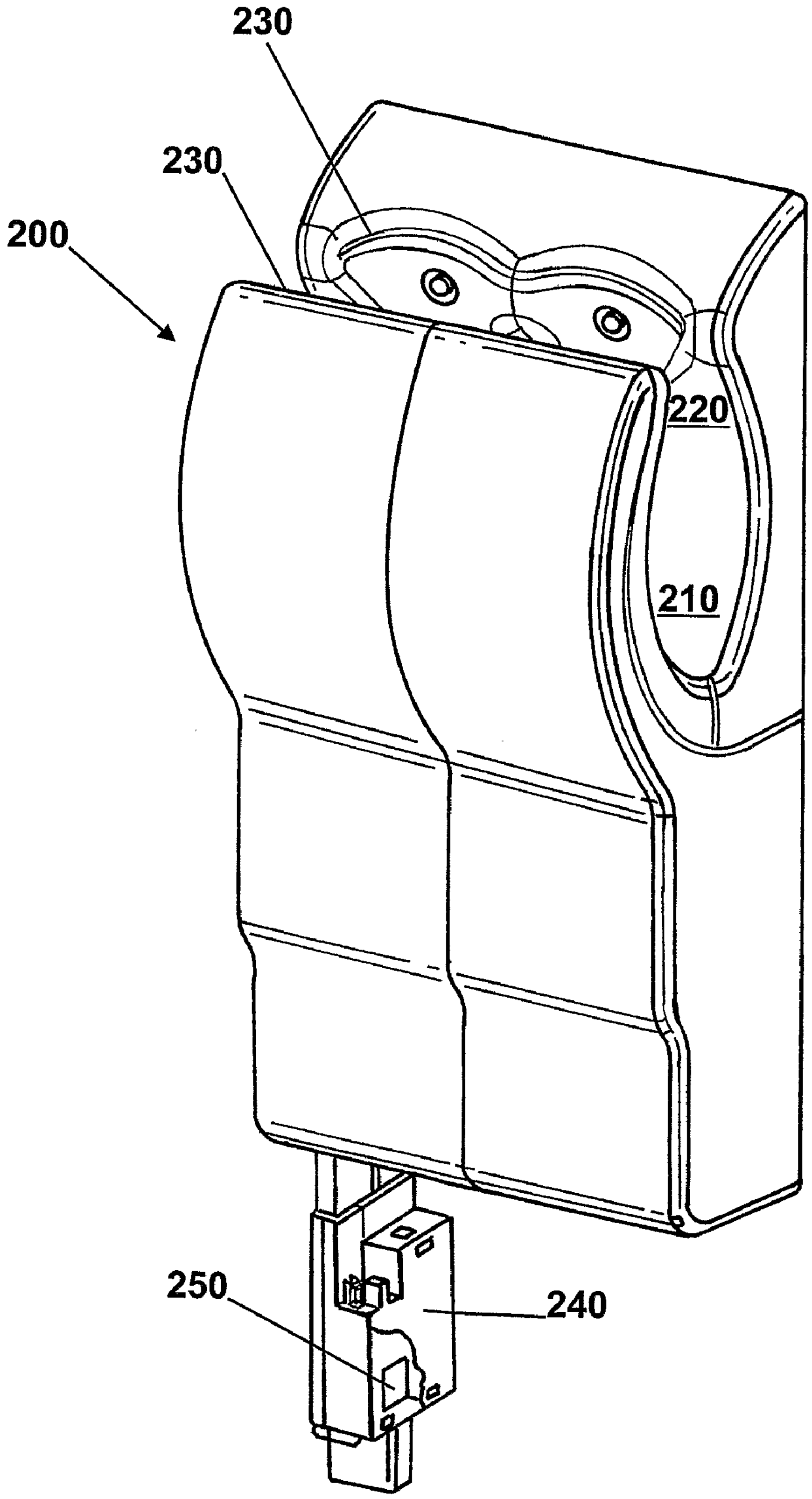
FIG. 6 shows a hand dryer incorporating a nebuliser controlled by the controller of FIG. 1.

The above-described embodiment of the invention is particularly suited for use in a hand dryer such as that shown in FIG. 6. The hand dryer 200 includes a cavity 210. The cavity 210 is open at its upper end 220 and the dimensions of the opening are sufficient to allow a user's hands (not shown) to be inserted easily into the cavity 210 for drying. A high-speed airflow is generated by a motor unit having a fan (not shown). The high-speed airflow is expelled through two slot-like openings 230 disposed at the upper end 220 of the cavity 210 to dry the user's hands. A drain (not shown) for draining the water removed from a user's hands from the cavity 210 is located at the lower end of the cavity 210. A nebuliser 240 is located downstream of the drain. The nebuliser 240 is shown partially removed from the hand dryer 200 in FIG. 5. The nebuliser 240 is partially cut away to show the location of the above-described drive circuit 250. The nebuliser 240 includes a collector (not shown) for collecting waste water and a piezoelectric crystal (not shown) for nebulising the waste water. The piezoelectric crystal is driven by a drive circuit 250 which includes, and is controlled by, the controller 1. The use of the controller 1 of the present invention allows the nebulisation system to be more efficient and reliable in operation. This will result in lower operating and maintenance costs for a consumer.

It will be appreciated that the invention is not limited to the embodiment illustrated in the drawings. The above-described embodiment of the invention with a controller 1 for controlling a piezoelectric crystal forming part of a nebulisation system is also suitable for use in other dryers such as laundry dryers. Other forms of drying apparatus could be envisaged by the skilled reader, for example, other forms of domestic or commercial drying apparatus such as washer-dryers, ventilation-type laundry dryers or full-length body dryers.

It will also be appreciated that magnitude and frequency of the drive source may be varied depending upon the required application. For example, it is common to drive a piezoelectric crystal at a range of frequencies. Alternatively, the piezoelectric crystal may be driven at a single, fixed frequency. However, it is most common to drive a piezoelectric crystal at, or close to, its resonant frequency. For most piezoelectric crystals this frequency lies in the range between 1.5 to 2 MHz. A preferred driving frequency is close to 1.7 MHz.

Any number of piezoelectric crystals and controllers could be implemented. For example, a single controller could control several piezoelectric crystals, for example if the volume of liquid to be nebulised is great. Alternatively, several controllers could be present to handle different types of liquid or operate at different times.

Additionally, the sample points of the temperature signal need not be uniformly spaced. They could be at irregular intervals and the rate of change of the temperature signal with time could be calculated by division. Further, the sample points could be taken when the piezoelectric crystal is being driven. This may be necessary if, for example, the piezoelectric crystal is driven by a constant waveform.

Further, other methods of switching the piezoelectric crystal off could be used. The digital output from the controller could be switched on or off, the drive signal from the PLL could be switched on or off, or a mechanical or electronic switch could be used between at any suitable point between the controller and the piezoelectric crystal to switch off the piezoelectric crystal.

Additionally, the piezoelectric crystal need not be switched off. The controller could simply vary the duty cycle or the frequency of oscillation of the piezoelectric crystal in response to the rate of change of temperature with time.

Additionally, the duty cycle at which the piezoelectric crystal is driven may be dependent upon other factors in addition to the temperature of the piezoelectric crystal. For example, the duty cycle may also be dependent upon the temperature of controller or a drive circuit containing the controller. In this case, one approach for controlling the duty cycle would be to set a maximum permissible duty cycle (for example 50%) for safe operation of the controller or drive circuit and the temperature of the piezoelectric crystal could be used to vary the duty cycle of the drive signal within the maximum permissible duty cycle.

Alternative methods for detecting the end third stage could be contemplated. For example, the controller could look for a specified time period, temperature or other condition of the piezoelectric crystal in order to determine the end of the relevant stages. What is important is that the controller is able to determine the temperature of the piezoelectric crystal and to vary the duty cycle of the drive signal in response to the temperature of the piezoelectric crystal.

The invention claimed is:

1. A hand dryer, comprising:

a cavity having an opening at an upper end, the opening being sized to allow a user's hands to be inserted into the cavity;

a plurality of slot-like openings positioned at the upper end of the cavity;

a motor unit, having a fan to generate high speed airflow, the fan being functionally connected to the plurality of slot-like openings to direct the high speed airflow through the slot-like openings;

a drain, located at a bottom end of the cavity, to receive water removed from the user's hands;

a collector, located downstream of the drain, to collect the water removed from the user's hands; and a nebulizer, located in the collector, the nebulizer, comprising, a high-frequency agitation source, a controller for the high-frequency agitation source, a signal generator to generate a drive signal having a variable duty cycle and being used to drive the high-frequency agitation source, and a temperature detector to detect a temperature of the high-frequency agitation source, wherein the controller is configured to vary the duty cycle of the drive signal in response to the temperature of the high-frequency agitation source.

2. A hand dryer as claimed in claim 1, wherein the controller varies the duty cycle in order to prevent the temperature of the high-frequency agitator exceeding a pre-determined operating temperature.

3. A hand dryer as claimed in claim 1 or 2, wherein the duty cycle is set to a maximum value by the controller at the start of an operation of the high-frequency agitation source.

4. A hand dryer as claimed in claim 1 or 2, wherein the controller is further configured to control the drive signal in response to a first pre-determined requirement and to determine when the first pre-determined requirement has been satisfied.

5. A hand dryer as claimed in claim 4, wherein the first pre-determined requirement is that the duty cycle is reduced below a pre-determined value.

6. A hand dryer as claimed in claim 4, wherein the first pre-determined requirement is the detection that a pre-determined time period has elapsed.

7. A hand dryer as claimed in claim 4, wherein the first pre-determined requirement is the detection of a pre-determined temperature condition.

8. A hand dryer as claimed in claim 4, wherein the controller is configured to cause the drive signal to switch off when the first pre-determined requirement is satisfied.

9. A hand dryer as claimed in claim 1 or 2, wherein the controller is arranged to cause the drive signal to switch off in the event that no change of temperature is observed when the high-frequency agitator is operated.

10. A hand dryer as claimed in claim 1 or 2, wherein the controller is arranged to cause the drive signal to switch off when the temperature exceeds a pre-determined maximum value.

11. A hand dryer as claimed in claim 1 or 2, wherein the controller determines a maximum operation time for which the drive signal shall remain on and causes the drive signal to switch off when the maximum operation time is exceeded.

12. A hand dryer as claimed in claim 1 or 2, wherein the controller detects the temperature of the high-frequency agitator at pre-determined intervals.

13. A hand dryer as claimed in claim 1, comprising a further temperature detector to detect the temperature of at least a part of the signal generator, the controller being configured to vary the maximum duty cycle of the drive signal in response to the temperature of the at least a part of the signal generator.

* * * * *